(12) United States Patent
Hannula et al.

(10) Patent No.: US 12,202,725 B2
(45) Date of Patent: Jan. 21, 2025

(54) METHOD FOR BONDING WAFERS, AND A WAFER

(71) Applicant: MURATA MANUFACTURING CO., LTD., Nagaokakyo (JP)

(72) Inventors: Konsta Hannula, Sipoo (FI); Marcus Rinkiö, Rajamäki (FI); Teemu Vasara, Espoo (FI); Altti Torkkeli, Tuusula (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 169 days.

(21) Appl. No.: 17/691,301

(22) Filed: Mar. 10, 2022

(65) Prior Publication Data

US 2022/0289567 A1 Sep. 15, 2022

(30) Foreign Application Priority Data

Mar. 11, 2021 (FI) .................................. 20215262

(51) Int. Cl.
*B81C 3/00* (2006.01)
(52) U.S. Cl.
CPC ........ *B81C 3/001* (2013.01); *B81C 2203/031* (2013.01); *B81C 2203/032* (2013.01); *B81C 2203/037* (2013.01)
(58) Field of Classification Search
CPC ........... H01L 24/63; H01L 2224/63–70; H01L 2224/71–72; H01L 2224/90; B81C 3/001; B81C 2203/031; B81C 2203/032; B81C 2203/037; B81C 1/00357; B81C 2203/035; B81C 2203/036; B81C 2203/058
See application file for complete search history.

(56) References Cited

U.S. PATENT DOCUMENTS

| | | | |
|---|---|---|---|
| 5,900,674 A | 5/1999 | Wojnarowski et al. | |
| 6,086,705 A | 7/2000 | Lee et al. | |
| 9,334,153 B1 | 5/2016 | Perahia et al. | |
| 2018/0148325 A1* | 5/2018 | Duqi | B81C 1/00238 |

FOREIGN PATENT DOCUMENTS

| | | |
|---|---|---|
| EP | 3306268 A1 | 4/2018 |
| WO | WO 2018/227308 A1 | 12/2018 |

OTHER PUBLICATIONS

Search Report dated Jul. 20, 2022, corresponding to European Patent Application No. 22157044.
Liudi Jiang et al: "A novel method for nanoprecision alignment in wafer bonding applications", Journal of Micromechanics and Microengineering, Institute of Physics Publishing, Bristol, GB, vol. 17, No. 7, Jul. 1, 2007, pp. S61-S67.
Finnish Search Report dated Oct. 7, 2021 corresponding to Finnish Patent Application No. 20215262.

* cited by examiner

*Primary Examiner* — Khaja Ahmad
*Assistant Examiner* — Sun Mi Kim King
(74) *Attorney, Agent, or Firm* — SQUIRE PATTON BOGGS (US) LLP

(57) ABSTRACT

An improved wafer bonding method applying at least one prebonding element that deflects in the out-of-plane direction.

17 Claims, 6 Drawing Sheets

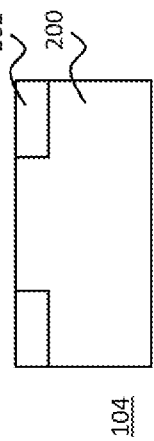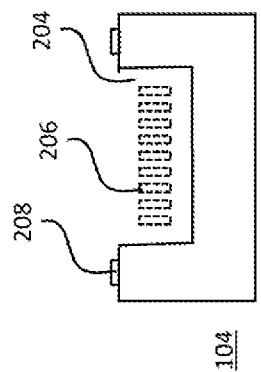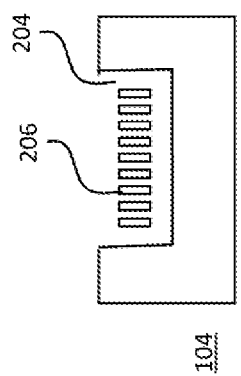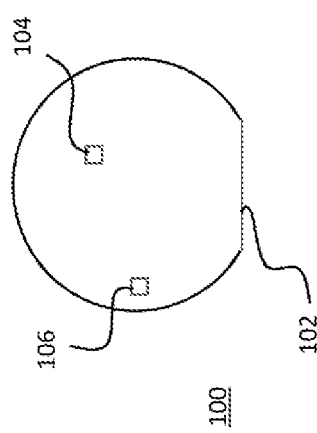

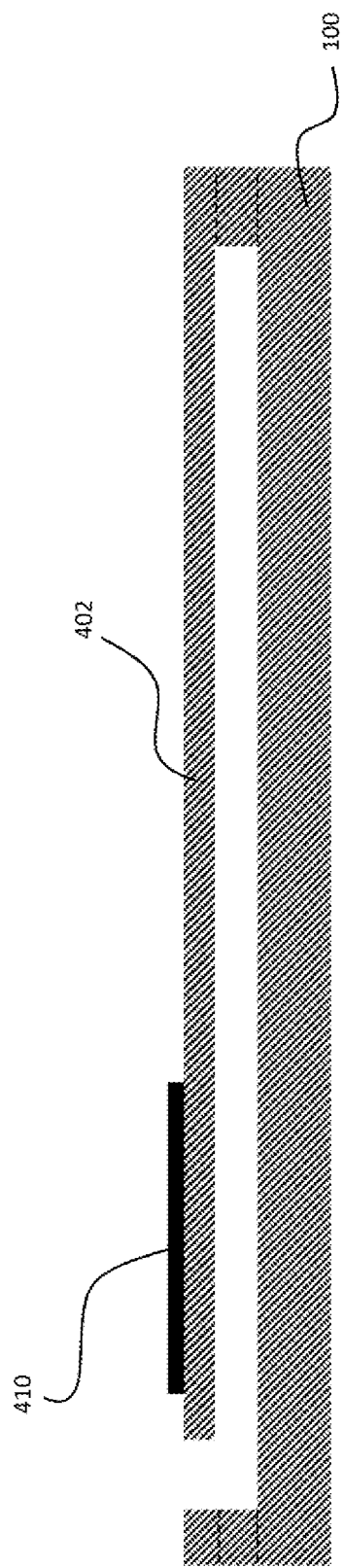
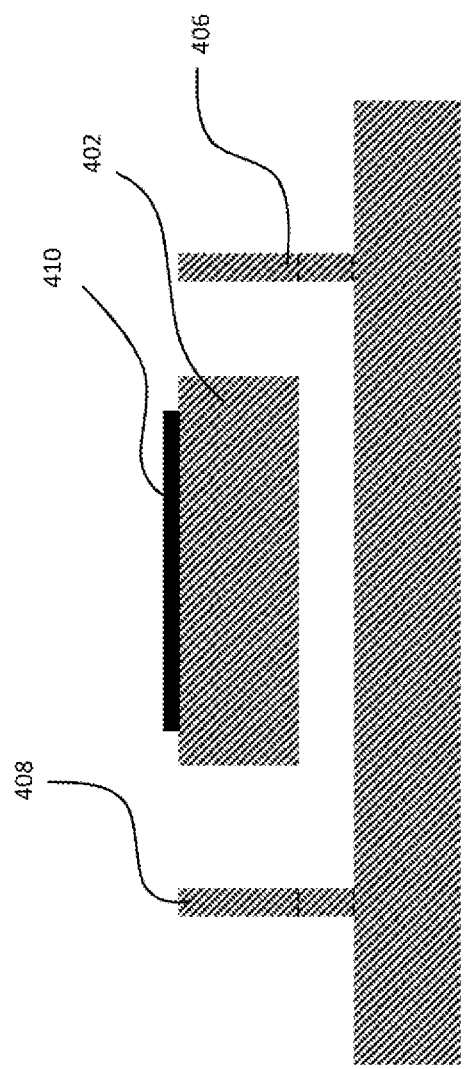

METHOD FOR BONDING WAFERS, AND A WAFER

FIELD OF THE DISCLOSURE

The present disclosure relates to a method for bonding wafers in a wafer bonding process. The present disclosure further concerns a wafer suitable to be bonded to another wafer in a wafer bonding process.

BACKGROUND OF THE DISCLOSURE

A wafer bonding process refers here to any process where a permanent contact is formed between the bonding surface parts of the first wafer and the bonding surface parts of the second wafer. This permanent contact encapsulates microstructures in bonded wafers into microelectromechanical elements where sensitive internal structures are protected from environmental influences such as temperature, moisture, high pressure and oxidizing species, for example. Examples of wafer bonding processes include direct bonding, surface activated bonding, plasma activated bonding, anodic bonding, eutectic bonding, glass frit bonding, adhesive bonding, thermocompression bonding, reactive bonding and transient liquid phase diffusion bonding.

When two wafers that include structures for microelectromechanical elements are bonded to each other, an accurate alignment between the wafers is extremely important. For example, in production of microelectromechanical systems, the misalignment tolerances of applicable element designs are of the orders of micrometres. When diameters of the wafer discs can range up to tens of centimetres, it is easily understood that maintaining the alignment until a permanent contact in the wafer bonding process is created is of utmost importance. The equation is simple, the greater the tolerances in the manufacturing setup, the larger dimensions in the designs need to be, and vice versa.

One of the detected vulnerabilities in the conventional setups are the necessary manoeuvres that take place between the alignment of the wafers and the actual wafer bonding process. Most of the wafer bonding processes require some type of annealing, electrical and/or chemical reaction stage that cannot be implemented with the same equipment that is used for the alignment. This means that the stack of aligned wafers needs to be moved to another equipment for the wafer bonding process.

This stage has been conventionally managed by locking the alignment with a jig and clamps that press the wafers against the jig. This conventional clamp mechanism works quite well but there is naturally a constant wish to even more efficiently eliminate undesired in-plane offsetting movements between the wafers after their alignment. Accordingly, a more rigid clamping effect to needs to be provided. Traditionally this would be solved by merely adding the number of clamps, but mere adding of clamps is not very effective and for some wafer bonding processes not even applicable. Before the bonding attachment is achieved, many wafer bonding processes include stages with fluid exchange (gas evacuation, pump and purge stages or the like). For this, the wafers are initially separated in the out-of-plane direction from each other in the jig with spacers. These are then removed before process stages in which the contact between the wafers becomes permanent. To maintain the in-plane alignment, the clamps between the spacers need to press the wafers together. Due to this local pressure, the uneven vertical pressure tend to deform the wafers so that the distance between the wafers near the clamps may become smaller than the distance near the spacers. This may cause adverse effects to the fluid flows in the wafer bonding process.

Another approach to reduce in-plane misalignments has been to employ a laser prebonding set to create an array of spots that "weld" glass wafers to silicon wafers without intermediate layers between them. A disadvantage with these rigid prebonding structures is that, as previously described, at some stage of the process, gas exchange between the wafers may be necessary, but in the final stages, the contact between the bonded surfaces needs to be firm so that a hermetically closing contact is achieved.

BRIEF DESCRIPTION OF THE DISCLOSURE

An object of the present disclosure is to provide a method that enables alleviating at least some disadvantages in the above described conventional solutions.

The object of the disclosure is achieved by a method and a wafer which are characterized by what is stated in the independent claims. Some exemplary embodiments are disclosed in the dependent claims.

The disclosed embodiments are based on a novel prebonding method and a prebonding element structure that enables an even adherent connection for safe manoeuvring of a wafer stack from alignment to the actual wafer bonding process, but also enables temporary vertical distancing between the wafers during the wafer bonding process.

BRIEF DESCRIPTION OF THE DRAWINGS

In the following the claimed solution will be described in greater detail by means of embodiments with reference to the accompanying drawings, in which FIG. 1 illustrates an exemplary wafer;

FIGS. 2a to 2d illustrate some examples of microstructures;

FIGS. 4a to 4c show top and side views of an exemplary prebonding element;

DETAILED DESCRIPTION OF THE DISCLOSURE

Figure 3B:
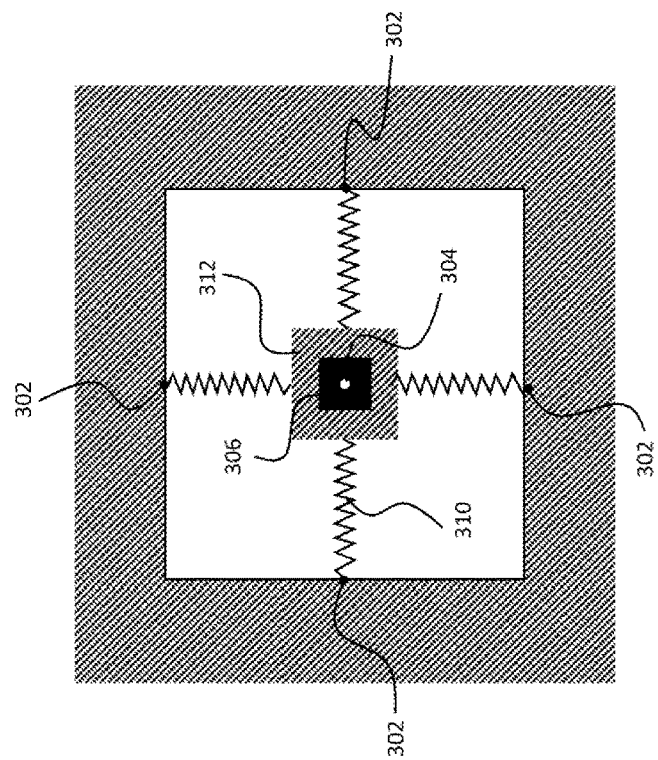
FIGS. 3a and 3b illustrate simple examples for a prebonding element.

The following examples describe a method for bonding wafers in a wafer bonding process. A wafer refers here to a slice of solid material(s) that can be used for the fabrication of microelectromechanical system (MEMS) elements. A wafer may be formed of uniform material or include layers of different materials. A wafer may also undergo microfabrication processes that shape it so that a surface of the resulting wafer is not uniformly planar but includes carefully controlled and dimensioned recesses and/or regions of various materials and shapes.

A wafer may thus include, for example, a uniform slice of glass, crystalline silicon wafer, or a structural wafer like a crystalline silicon wafer with insulator and polysilicon layers on it, a silicon-on-insulator (SOI) wafer, a cavity SOI wafer (C-SOI) or a device wafer layer of C-SOI wafer. As an example of a structural wafer, a silicon-on-insulator (SOI) wafer typically comprises a handle wafer layer, a buried oxide (BOX) layer, and a device wafer layer. The handle wafer layer is usually the thickest part, some hundreds of microns thick, while the device wafer layer is typically tens of microns thick. The BOX layer is typically from fraction of a micron to a few microns thick. The BOX layer may be deposited either on the handle wafer layer, or the device wafer layer, and the two pieces of silicon may be bonded to each other so that the BOX layer is in between them and isolates the device wafer layer electrically from the handle wafer layer. Structures with electromechanical properties are typically manufactured into the device wafer layer of a SOI wafer by etching trenches into and/or through the device wafer layer. Sacrificial etching of the BOX layer can be used to mechanically release selected MEMS structures also from the BOX layer. The thickness of the device wafer layer may be in the order of a few tens of µm, but SOI wafers are available at different device wafer layer thicknesses ranging from a few µm to 100 µm or more.

In order to enable wafer bonding, a wafer includes bonding surface parts that are designed to get into permanent contact with bonding surface parts of another wafer in the wafer bonding process. Advantageously, but not necessarily, the bonding surface parts are locally planar and align to a contact plane that is common to all bonding surface parts of the wafer. However, both wafers to be bonded do not necessarily need to be microprocessed before bonding. One wafer may provide a planar surface that is bonded to a recessed surface of another wafer.

These basic concepts are illustrated with examples in FIG. 1 and FIGS. 2a to 2c. FIG. 1 illustrates an exemplary wafer 100 formed of a crystalline semiconductor material. Wafers typically have one or more flats 102 or notches cut into one or more sides of the wafer to indicate crystallographic planes of the wafer. If the wafer has undergone a microfabrication process, several microstructures 104 have been formed onto it. The microfabrication process may include one or more subprocesses, like doping, ion plantation, etching, thin-film deposition, and/or photolithographic patterning, for example. Through the wafer bonding process, each of these microstructures 104 gets into a permanent contact with a corresponding microstructure in another wafer and the microstructures thereby form a MEMS element. Finally, the individual MEMS elements can be separated into dies by wafer dicing and then further forwarded for device packaging.

Microstructures 104 in at least one of the wafers to be bonded often include recesses. These are needed, for example, in a final MEMS element to provide an open space in which the mechanically moving parts of the system can move. To enable controlled mechanical operation of the system, such open spaces preferably become hermetically closed when opposing microstructures are permanently attached to each other in the wafer bonding process.

FIGS. 2a to 2d illustrate some examples of microstructures of FIG. 1. As explained above, the wafer 100 of FIG. 1 includes a plurality of microstructures, some exemplary forms of which are shown with FIGS. 2a to 2d. In order to minimize the cost per die, the number of dies that can be made from a single wafer is typically maximized.

FIG. 2a illustrates a simple form of a microstructure 104 that has a non-patterned, planar surface. Such a microstructure in one wafer may be bonded to a microstructure in another wafer, and the latter may comprise one or more recesses and bonding surface parts. In the wafer bonding process, bonding surface parts in opposing microstructures become permanently fixed to each other such that the recesses form hermetically closed cavities. The microstructure of 2a may be, for example, a glass layer element that is to be bonded to a microstructure that includes mirror and spring elements of an optical device. The microstructure of 2a may also be, for example, a semiconductor plate designed to extend over a gap formed for a pressure sensor microstructure in the opposing wafer. These are examples only, other types of microstructures with the same form are included in the scope.

FIG. 2b illustrates another type of a microstructure that still includes a planar surface but has been microfabricated to include regions of different materials. These regions may exist in the microstructure, for example, to form bonding surface parts that through their material characteristics enable or even induce a chemical, electrical, adhesive or other mechanism necessary to implement the wafer bonding process and form a desired permanent contact between bonding surface parts in opposing microstructures. The microstructure 104 of FIG. 2b may include, for example, a silicon substrate 200 onto which regions of glass have been microfabricated to form bonding surface parts 202. By such bonding surface parts the microstructure can be sealed to silicon or metal surfaces in an opposing microstructure in an anodic bonding process. However, this is an example only, other type of materials, microfabricated forms and bonding methods with similar surface forms may be applied in the scope.

FIG. 2c illustrates a microfabricated microstructure 104 that includes a recess 204 and mobile structure parts 206 that extend into the recess. The mobile structure parts 206 are thus surrounded by a void space in which they can move in order to implement the designed function of the MEMS element the microstructure is part of. The microstructure of FIG. 2c may be, for example, a part of a microelectromechanical accelerometer device and the mobile structure parts 206 may include comb structures for capacitive detection. However, this is an example only, other type of materials, microfabricated forms and bonding methods with similar surface forms may be applied in the scope.

FIG. 2d illustrates a further example where bonding surface parts 202 of the microstructure 104 are not planar but include some inwards and/or outwards extending formations that are intended to bond with matching formations in bonding surface parts of the opposite microstructure. FIG. 2d shows an example where the formation is a protuberance 208.

As mentioned above, a wafer bonding process refers here to any process where a permanent contact is formed between the bonding surface parts of the first wafer and the bonding surface parts of the second wafer. This permanent contact encapsulates said microstructures in bonded wafers into MEMS elements where sensitive internal structures are protected from environmental influences such as temperature, moisture, high pressure and oxidizing species, for example. Examples of wafer bonding processes include direct bonding, surface activated bonding, plasma activated bonding, anodic bonding, eutectic bonding, glass frit bonding, adhesive bonding, thermocompression bonding, reactive bonding and transient liquid phase diffusion bonding. However, the invention is applicable in any wafer bonding process where mechanisms and reactions that form the permanent bonding between the bonding surface parts of the microstructures may be adversely affected by in-plane offset of wafers to be bonded.

Returning back to FIG. 1, embodiments of the present disclosure disclose an exemplary arrangement where one of the wafers includes a prebonding element 106 that enables fastening of a first wafer to a second wafer for the duration of the wafer bonding process in a way that maintains accurate alignment of microstructures in opposing wafer surfaces before and during the wafer bonding process, but avoids the adverse effects of the conventional fixed prebonding methods on the wafer bonding process. It should be noted that the disclosed solution is a simple example, in implementations, each wafer to be bonded may include one or more prebonding elements and prebonding elements may be arranged to one, both or all wafers to be bonded. When the individual MEMS elements are separated into dies by wafer dicing, the one or more prebonding elements are also released from the wafer stack.

Figure 3A:
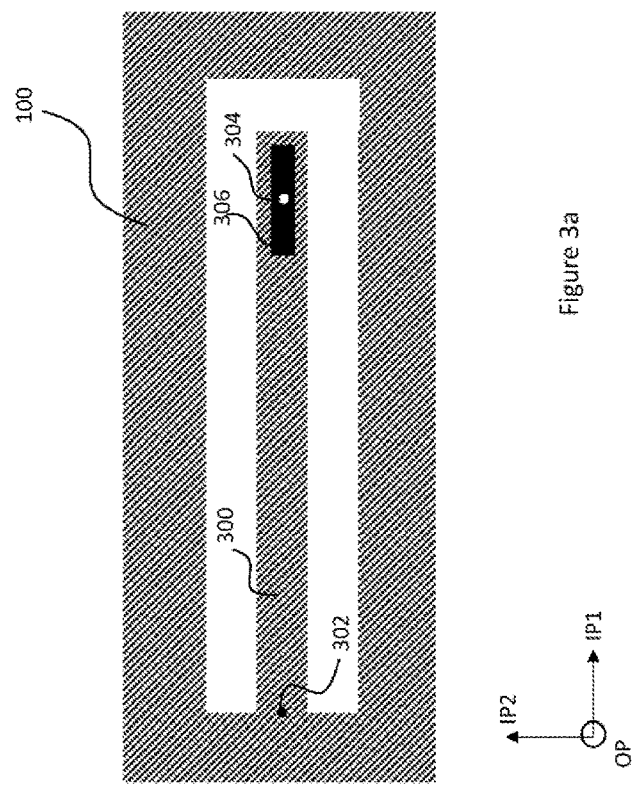

FIG. 3a illustrates a simple example of a prebonding element 300. The example of FIG. 3a shows the prebonding element in a top view to a surface of the first wafer 100. As shown in FIG. 3a, the first wafer 100 is considered to extend in two orthogonal in-plane directions IP1 and IP2. As discussed with FIGS. 2b to 2d and also shown in FIG. 3a, the first wafer may include microfabricated recesses or protuberances, but the in-plane directions IP1 and IP2 are easily conceived through the planar surface of the initial wafer disc from which the first wafer has been formed of. FIG. 3a shows also an out-of-plane direction OP that is orthogonal to the first in-plane direction IP1 and to the second in-plane direction IP2. In this disclosure, the in-plane directions IP1 and IP2 are also called as horizontal directions, and the out-of-plane direction OP as the vertical direction. The prebonding element 300 in this example is formed of the first wafer 100. In other words, the prebonding element 300 is microfabricated into the first wafer 100 by removing material from the first wafer 100, for example by etching, laser ablation, or some similar process. Alternatively, the prebonding element 300 may be formed as a layered element on the first wafer 100. For example, layers of polysilicon may be applied for the purpose.

The prebonding element 300 includes a first element point 302 and a second element point 304 and an elastic element that extends between the first element point 302 and the second element point 304. The first element point 302 is at a region through which the prebonding element 300 is fixed to the first wafer 100. The elastic element is configured to deflect between the first element point 302 and the second element point 304 and to thereby enable movement of the second element point 304 in the out-of-plane direction of the first wafer. This ability of the prebonding element 300 to deflect in the out-of-plane direction and deflect only minimally or practically none at all in the in-plane direction is utilised to minimise in-plane offset of wafers to be bonded. This is implemented by forming an adherent contact between a region around the second element point on the prebonding element and the second wafer.

In some cases, the adherent contact between the region around the second element point on the prebonding element and the second wafer can be formed without any intermediate material layers. For example, when the interface between the prebonding element and the second wafer is a silicon-glass interface the adherent contact can be made with a silicon-to-glass laser pre-bonding arrangement that allows accurate creation of bond spots to the silicon-glass interface.

Alternatively, an intermediate prebonding layer may be applied to form the adherent contact. In the following, this alternative is illustrated with an example where a patch layer of prebonding material 306 that covers a region around the second element point 304 is deposited on the prebonding element 300.

It should be noted, however, that the patch layer of prebonding material 306 can alternatively be created on the second wafer, opposite the prebonding element 300 and the second element point 304. The patch layer of prebonding material may be a layer deposited on the second wafer so that the second element point coincides with the patch layer of prebonding material in the out-of-plane direction. In other words, we may consider a reference plane that is defined by two intersecting lines that run in the two in-plane directions IP1 and IP2. The second element point then coincides with the patch layer of prebonding material in the out-of-plane direction if the projection of the second element point on the reference plane is within the projection of the patch layer of prebonding material on the reference plane.

The term patch implies here that the horizontal dimensions of the deposited material forming the patch layer covers only a very limited region around the second element point. The term layer implies here that the vertical dimension of the deposited material forming the patch layer is considerably (at least ten times) smaller than the horizontal dimensions. The vertical and horizontal dimensions of the material deposited for the patch layer of prebonding material are optimised to enable an adequate adherent contact between the prebonded wafers until creation of the permanent contact in the wafer bonding process, but to avoid adding any unnecessary fixed vertical offset between the wafers.

In the wafer bonding process, the first wafer 100 needs to be aligned with the second wafer so that bonding surface parts of the first wafer 100 are aligned with bonding surface parts of an opposing second wafer. In other words, in a projection in the out-of-plane direction OP, bonding surface parts of a first wafer are adjusted to maximally overlap bonding surface parts of the second wafer. As a result of the alignment, the patch layer of prebonding material 306 on the prebonding element 300 gets also in contact with the second wafer, or the prebonding element 300 layer on the second wafer gets to be aligned with the prebonding element 300 in or on the first wafer. The patch layer of prebonding material 306 is then activated to maintain the extremely important accurate horizontal alignment of the wafers. Activation in this context refers to an operation that temporarily or permanently transforms the patch layer of prebonding material 306 so that it forms an adherent contact between the prebonding element 300 and the second wafer. This transformation may be activated, e.g. by heating the layer of a prebonding metal material so that it melts between the prebonding element 300 and the second wafer, and after cooling attaches the prebonding element 300 and the second wafer to each other. The patch layer of prebonding material may include, for example, Titanium, and it may be activated with laser. Other materials and activation methods, like room temperature bonding, well known to a person skilled in the art may be applied in the field. After activation of the prebonding material, the attached wafers are ready to be processed in the wafer bonding process where the actual permanent contact between the bonding surface parts of the first wafer and the bonding surface parts of the second wafer is created.

In the example of FIG. 3a, the prebonding element includes a cantilever beam that has been formed of the first wafer 100 by removing material from a region that surrounds the cantilever beam all the way through the first wafer. If the wafer is formed of a layer of a SOI wafer, like a device wafer layer, the cantilever beam is also mechanically released from the underlying layer, like a BOX layer. One end of the cantilever beam is thus firmly attached and supported by the first wafer and the other end of the cantilever beam is unsupported and free to move. Accordingly, when placed under a load in the unsupported end, the cantilever beam can deform and thus deflect in the out-of-plane direction OP. The first element point 302 is in a region through which the prebonding element 300 is fixed to the first wafer 100, which in this example means the position where the cantilever beam structure begins. The second element point 304 is in a region at or close to the unsupported end of the cantilever beam so that the cantilever beam extends between them to implement the function of the elastic element. The second element point 304 is covered by the patch layer of prebonding material 306. The patch layer of prebonding material can then be activated so that it becomes attached both to the unsupported end of the prebonding element 300 and to a region in the second wafer.

Under a force acting on the second element point 304, the deflection of the cantilever beam depends on the length of the beam, the modulus of elasticity of the material of the first wafer and the area moment of inertia of the beam's cross section. In this configuration, the material of the cantilever beam is the material of the first wafer, and the thickness (the vertical dimension) of the cantilever beam equals the thickness of the wafer, but the length of the cantilever beam, the constitution of the cantilever beam (e.g. recessed or not uniform) and the form factor of the cross section of the cantilever beam can be adjusted so that a desired level of rigidity in the in-plane direction and in the out-of-plane direction is achieved.

The in-plane rigidity of the prebonding element, alone or in combination with other prebonding elements, effectively reduces the risk of in-plane misalignment in transferring the wafers to a chamber where the wafer bonding process is implemented, or in wafer bonding process stages within the chamber. Furthermore, the microscale size of the prebonding element 300 enables creating the desired attachment into one position or more carefully selected positions so that the pressing force of the clamps can be reduced, or the conventional clamps are not needed at all. The risk that the prebonded wafers locally bend closer to each other at locations under the clamps and further from each other at locations between them is significantly reduced, which improves the accuracy of the alignment in the wafer bonding process. On the other hand, the out-of-plane elasticity of the prebonding element enables moving the first wafer and the second wafer temporarily away from each other (e.g. by means of spacers) and thus maintain an open space for fluid flows in the wafer processing stage.

FIG. 3b illustrates another example of an alternative structure for the prebonding element 300. The prebonding element 300 includes now four first element points 302, a second element point 304, and four elastic elements 310. The first element points 302 are in regions through which the prebonding element 300 is fixed to the first wafer 100, which in this example means in regions where elastic elements connect to the surrounding wafer 100. Two of the first element points can be connected with a line that is parallel to the first in-plane direction IP1 and two of the first element points can be connected with a line that is parallel to the second in-plane direction IP2. The elastic elements 310 connect to a pad 312 and the second element point is in the middle of the pad 312. Each of the elastic elements 310 is configured to elastically deflect between the respective first element point 302 and the second element point 304 and thus enable movement of the second element point 304 in the out-of-plane direction of the first wafer.

Again, as discussed above, the adherent contact can be formed without any intermediate layers or a patch layer of prebonding material may be used for the purpose. A patch layer of prebonding material 306 is deposited on the first wafer or on the second wafer so that after activation, the patch layer of prebonding material 306 covers a region around the second element point 304, and attaches the first wafer and the second wafer to each other.

Figure 4A:
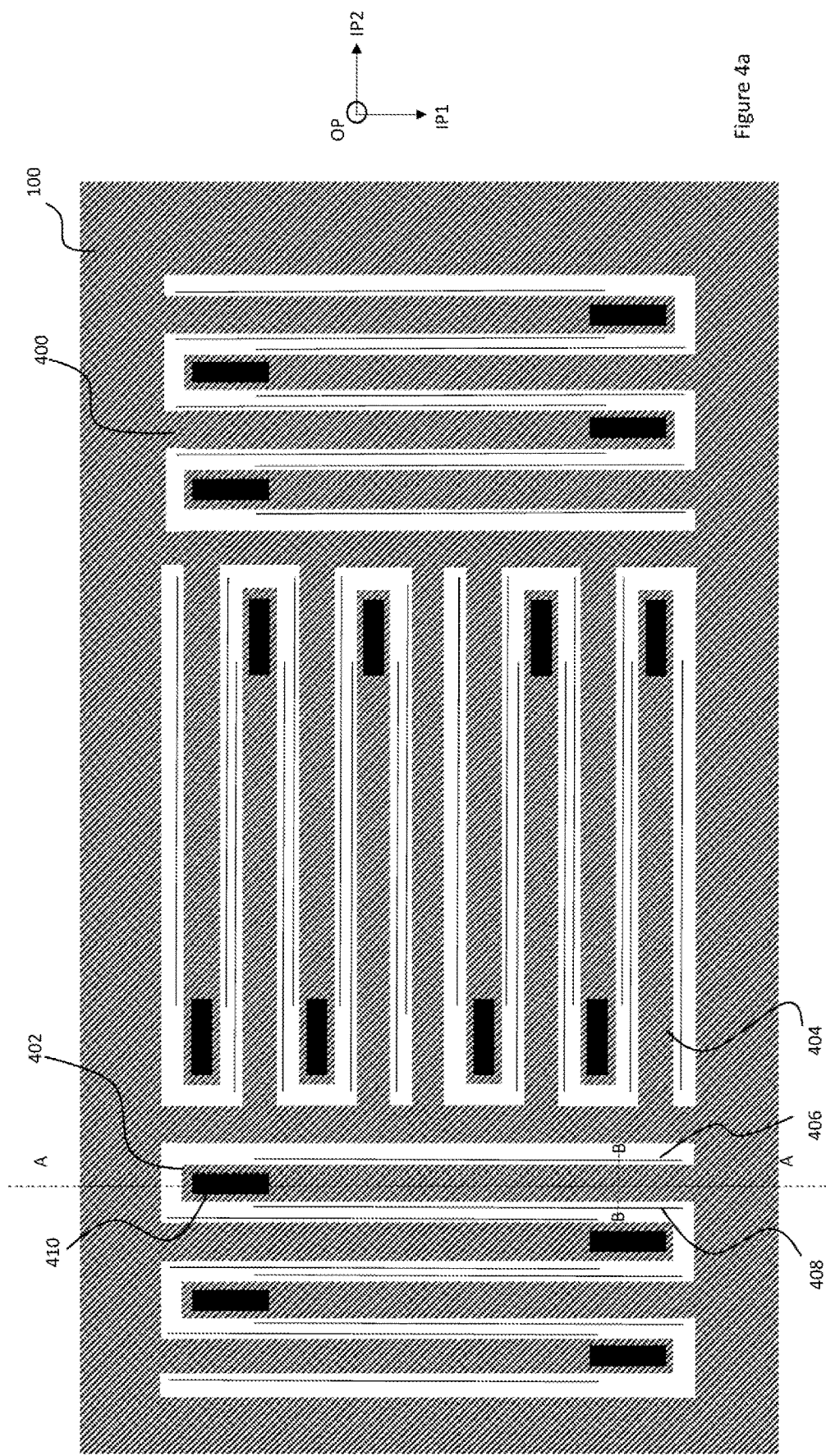

The structures described with FIGS. 3a and 3b are examples that describe the elements and function of the prebonding element in simple terms. FIGS. 4a and 4b illustrate a further example embodiment, which applies the form of the prebonding element 300 of FIG. 3a and introduces some additional features that may be applied separately or jointly to enhance the advantageous effects of the basic concept.

FIG. 4a shows a top view a prebonding element 400 that may be included in a wafer 100 of FIG. 1. The prebonding element includes a plurality of cantilever beams described in more detail with FIG. 3a. The prebonding element 400 includes cantilever beams 402 that extend in parallel in the first in-plane direction IP1. In FIG. 4a, one cantilever beam 402 that extends in the first in-plane direction IP1 has been denoted with a reference number. All shown cantilever beams extending in the same orientation can be considered to form a first set of cantilever beams. As already discussed, material properties and the thickness of the wafer typically depend on the functionality of the resulting MEMS element so in this respect there are many parameters that limit the design of the prebonding element. With the added number of cantilever beams it is possible to create a controlled stiffness for the adherent but elastic contact that is provided by the prebonding element.

It is easily understood that after the alignment and before the wafer bonding, forces upon the adherent contact provided by the prebonding element(s) do not appear only in the out-of-plane direction OP. It may be that dimensional and material properties of the cantilever beam(s) can be designed to provide the required elasticity in the out-of-plane direction OP but necessary stiffness to prevent misalignment in the in-plane directions IP1, IP2. However, this is not always the case. A cantilever beam does not easily compress or stretch in the direction of its length, but it tends to deflect under a force in the direction that is perpendicular to the direction of its length. For example, the cantilever beam 402 that extends in the first in-plane direction IP1 may deflect also in the second in-plane direction IP2. However, in the configuration of FIG. 4a, such deflections are limited by adjacent cantilever beams that extend to the same direction. Accordingly, the multiplication of parallel cantilever beams provides an effective way to restrict in-plane deflections before and during the wafer bonding process.

In order to further reduce such in-plane deflections, the prebonding element may include a first set of cantilever beams that extend in the first in-plane direction IP1 and a second set of cantilever beams that extend in the second in-plane direction IP2. In FIG. 4a, one cantilever beam 404 that extends in the second in-plane direction IP2 has been denoted with a reference number. All shown cantilever beams extending in the same orientation can be considered to form a second set of cantilever beams.

FIG. 4a illustrates an example where layers of prebonding material 410 are advantageously deposited on the first wafer or on the second wafer so that after activation, the layers of prebonding material attach regions on cantilever beams in the first and the second set of cantilever beams to the second wafer. As discussed earlier, in some applications, the adherent attachment can be implemented through direct contact between the prebonding element and the second wafer, without the separate layer 410 of prebonding material. The first set of cantilever beams limits parasitic in-plane motions in the second in-plane direction IP2 and the second set of cantilever beams limits parasitic in-plane motions in the first in-plane direction IP1. Through this combination of cantilever beams in two orthogonal in-plane directions, possible in-plane misalignment between wafers to be bonded are effectively suppressed by the prebonding element, but the controlled elasticity in the out-of-plane direction desired for the wafer process is maintained.

To further restrict the possible in-plane misalignments, the prebonding element 400 may include one or more longitudinal stopper elements 406. A stopper element 406 may be a longitudinal structural element that is fixedly attached to an underlying layer and extends parallel to a cantilever beam but is separated by a non-zero distance from the cantilever beam. The underlying layer refers here to a layer from which the prebonding element is mechanically released. For example, if the first wafer is a device wafer layer of a structural wafer, and the cantilever beam has been separated from an underlying handle wafer layer by sacrificial etching in the BOX wafer layer, the stopper element 406 is fixed to the handle wafer layer. The stopper element 406 may be formed of the BOX layer wafer and the device layer wafer of the original structure wafer, or it may be of a different material, deposited on the handle wafer layer or remains of the BOX layer wafer after the sacrificial etching.

Advantageously, but not necessarily, for each cantilever beam there are two longitudinal stopper elements 406, 408, which extend parallel to the cantilever beam 402 on both sides of the cantilever beam 402, as shown in FIG. 4a. These pairwise arranged stopper elements that in this example run parallel to the first in-plane direction IP1 reduce and by far eliminate in-plane deflections of the cantilever beam 402 in the positive second in-plane direction IP2 and in the negative in-plane direction IP2.

FIG. 4b illustrates the prebonding element 400 in a side view along line A-A shown in FIG. 4a. As shown, the wafer 100 may be of a uniform material, or formed of a device wafer layer of a structural wafer. Boundaries of wafer layers in a structural wafer are illustrated with dashed lines in FIG. 4b. When the adherent contact is made directly, the protrusion of the patch layer of prebonding material can be omitted. However, the prebonding element could be intentionally formed to have such protrusion to ensure that it is the first and only point in touch with the second wafer at the time the adherent contact is activated.

FIG. 4c illustrates the prebonding element 400 in another side view along line B-B shown in FIG. 4a. FIG. 4c shows also the optional stopper elements 406, 408.

Figure 5:
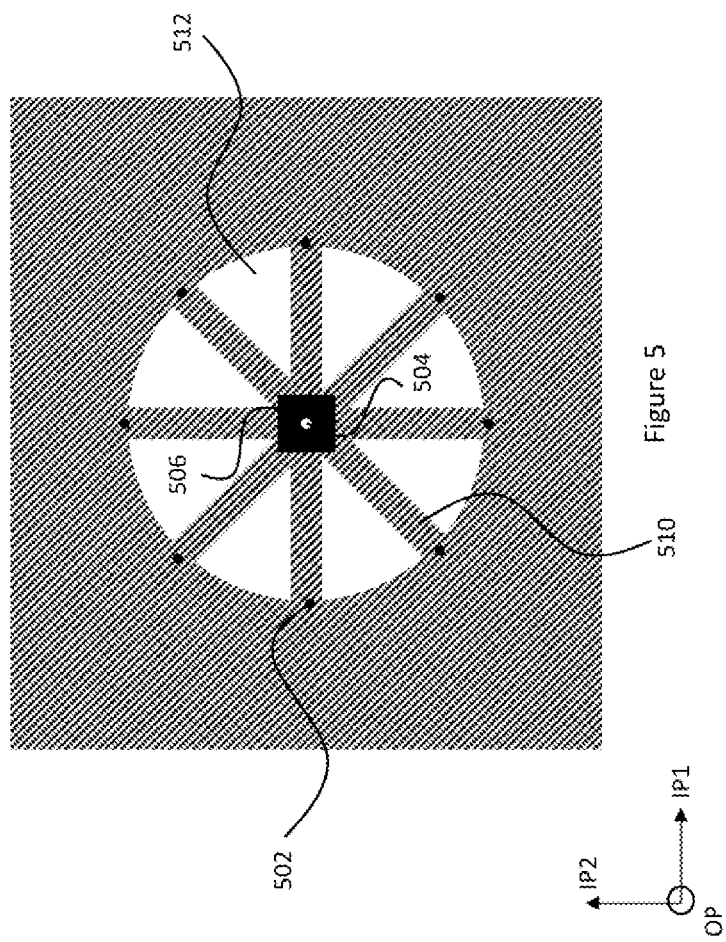
FIG. 5 illustrates stages of the disclosed method.

FIG. 5 illustrates another example structure for the prebonding element 500. The structure of FIG. 5 provides a way to effectively limit and reduce parasitic in-plane deflections and thereby suppress possible in-plane misalignment between wafers to be bonded. For the prebonding element 500 an opening 512 is made to the first wafer and the prebonding element includes two or more first element points 502 in separate regions through which the prebonding element is fixed to the first wafer. The prebonding element includes two or more elastic elements, 510 each of which extends from one first element point to a common second element point 504 in the middle of the opening.

FIG. 5 shows an example where each elastic element includes a cantilever beam and has a first element point 502 in a region through which the prebonding element is fixed to the first wafer. The first element points 502 are separate from each other, but the elastic elements 510 connect to each other at a common second element point 504. If two adjacent cantilever beams of elastic elements 510 are considered to align with sides of an angle, advantageously angles between all elastic elements 510 are the same. In other words, the prebonding element is formed within an opening of the first wafer, and the first element points 502 are evenly distributed to the circumference of the opening.

The example prebonding element 500 of FIG. 5 includes eight elastic elements 510, each of which includes a cantilever beam. One end of each cantilever beam is connected to a first element point 502. The first element points 502 are in regions through which the prebonding element 500 is fixed to the first wafer 100. In this example this again means that the first element points are in regions where elastic elements connect to the surrounding wafer 100. The first element points 502 are evenly distributed to a circumference of a circular opening, which in this example means that an angle between two adjacent cantilever beams is 45 degrees. It should be noted that the number of elastic elements and first element points is exemplary only, depending on the configuration, some other number of elastic elements may be applied for the purpose. For example, a combination of sixteen elastic elements and sixteen first element points 302, evenly distributed to a circumference of a circular opening is possible.

The prebonding element 500 includes also a common second element point 504 that is in the point where the elastic elements connect to each other in the middle of the opening. Each of the elastic elements 510 is configured to deflect between the respective first element point 502 and the second element point 504 and thus enable movement of the second element point 504 in the out-of-plane direction of the first wafer. A patch layer of prebonding material 506 is deposited on the first wafer or on the second wafer so that after activation, the patch layer of prebonding material 506 covers a region around the second element point 504.

Figure 6:
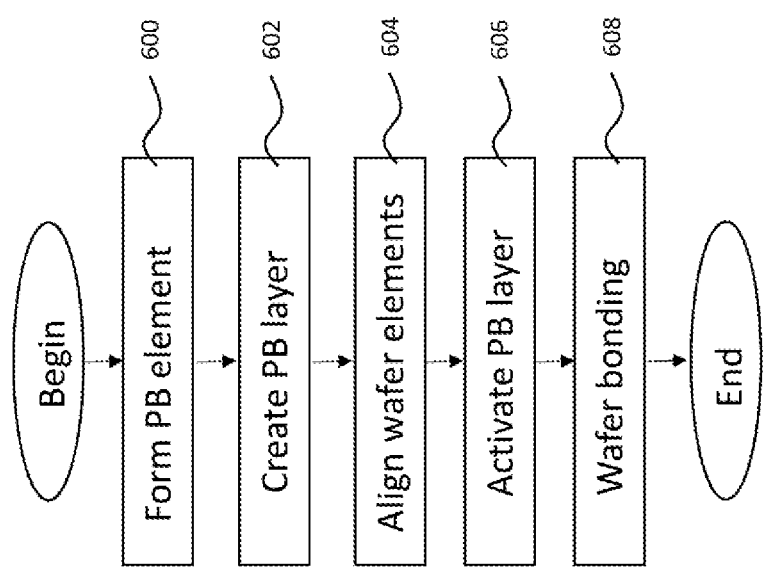
FIG. 6 illustrates use of the method in wafer bonding of three wafers.

FIG. 6 illustrates stages of the method explained through the examples of FIGS. 1 to 5, so additional description to the terms and expressions may be referred from those Figures and their description. The method begins by forming (stage 600) at least one prebonding element that includes a first element point, a second element point, and an elastic element. The first element point is in a region through which the prebonding element is fixed to the first wafer. The elastic element extends from the first element point to the second element point and the elastic element is configured to deflect between the first element point and the second element point to enable movement of the second element point in an out-of-plane direction of the first wafer.

A patch layer of prebonding material is created (stage 602) on the first wafer or on the second wafer. The layer coincides in the out-of-plane direction with a region around the second element point. The first wafer is aligned (stage 604) with the second wafer so that bonding surface parts of the first wafer are aligned with bonding surface parts of the second wafer. After this alignment, the patch layer of prebonding material can be activated (stage 606) to form an adherent contact between the prebonding element and the second wafer.

When the first wafer and the second wafer have been attached to each other through the prebonding element, the set of wafers can be safely manoeuvred (stage 608) in the wafer bonding process without compromising the critical alignment between them. The wafer bonding process can then be implemented in a normal manner so that a permanent contact is formed between the bonding surface parts of the first wafer and the bonding surface parts of the second wafer.

It should be noted that the method described with FIG. 6 refers only to parts of a process that are relevant in view of the invention. For a person skilled in the art it is clear that handling of wafers to be bonded before and during a wafer bonding process includes several stages that are well known and thus not described here in detail. For example, as mentioned earlier, wafers to be bonded may be initially separated by spacers to enable exchange of gases or other process-related fluids between them in early stages of the wafer bonding process. Furthermore, the prebonding element(s) may be used to fully replace clamps that press wafers against the jig, or as a complement to said clamps to ensure more even distribution of the pressuring forces.

Figure 7:
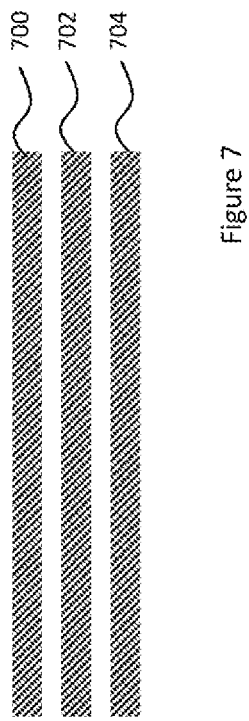
FIG. 7 illustrates an example of three wafers that may be prebonded to each other before a wafer bonding process.

The basic concept has been so far described with the elementary combination of two wafers. The invention is not, however, limited to wafer bonding of two wafers but can be applied in wafer bonding of two or more wafers. FIG. 7 illustrates an example of three wafers 700, 702, 704 that may be prebonded to each other before a wafer bonding process. The above described prebonding method can be applied to maintain the desired alignment between wafers 700, 702, 704 when they are wafer bonded to each other in a common wafer bonding process. The method can be applied also to first maintain the desired alignment between two wafers 700, 702 when they are wafer bonded to each other in a first wafer bonding process, and then between a wafer bonded wafer 700, 702 and the further wafer 704 in a second wafer bonding process.

The invention claimed is:

1. A method for bonding a first wafer to a second wafer in a wafer bonding process, wherein each of the wafers extends planarly in two mutually orthogonal in-plane directions and comprises one or more bonding surface parts for forming a permanent contact between the wafers, wherein at least one of the wafers includes microstructures fabricated into the wafer, and the method comprises:
    forming at least one of the wafers to include at leas a first prebonding element and a second prebonding element, and each of the first and the second prebonding elements includes a first element point, a second element point, and an elastic element wherein the first element point is in a region through which the prebonding element is fixed to the first wafer, the elastic element extends from the first element point to the second element point and the elastic element is configured to deflect between the first element point and the second element point to enable movement of the second element point in an out-of-plane direction of the first wafer, wherein the out-of-plane direction is orthogonal to the two in-plane directions; wherein the elastic element in the first prebonding element extends in a first in-plane direction and the elastic element in the second prebonding element extends in a second in-plane direction, and the first in-plane direction is not parallel with the second in-plane direction;
    aligning the first wafer with the second wafer so that bonding surface parts of the first wafer are aligned with bonding surface parts of the second wafer; and
    implementing the wafer bonding process in which a permanent contact is formed between the bonding surface parts of the first wafer and the bonding surface parts of the second wafer.

2. The method according to claim 1, wherein the at least one prebonding element is formed from the first wafer.

3. The method according to claim 1, wherein the at least one prebonding element is formed on the first wafer.

4. The method according to claim 1, further comprising:
    depositing a patch layer of prebonding material on the first wafer so that it covers a region around the second element point on the prebonding element; and
    activating the patch layer of prebonding material to form an adherent contact.

5. The method according to claim 1, further comprising:
    creating a patch layer of prebonding material on the second wafer so that the second element point coincides with the patch layer of prebonding material in the out-of-plane direction; and
    activating the patch layer of prebonding material to form the adherent contact.

6. The method according to claim 1, further comprising:
    forming the prebonding element to include a cantilever beam that has a supported end and an unsupported end such that the first element point coincides with the supported end of the cantilever beam.

7. The method according to claim 6, further comprising:
    forming the prebonding element to include a first set of cantilever beams extending in parallel in one of the two in-plane directions.

8. The method according to claim 7, further comprising:
    forming the prebonding element to include a second set of cantilever beams extending in parallel in another one of the two in-plane directions.

9. The method according to claim 6, wherein the first wafer is a device wafer layer of a structural wafer, and wherein the method further comprises:
    mechanically releasing the one or more cantilever beams from a handle wafer layer of the structural wafer;
    forming longitudinal stopper elements, each of which is fixed to the handle wafer layer and extends parallel to the cantilever beam but separated by a non-zero distance from the cantilever beam.

10. The method according to claim 9, further comprising forming for each cantilever beam one or two longitudinal stopper elements extending parallel to the cantilever beam on one or both sides of the cantilever beam, respectively.

11. The method according to claim 1, further comprising:
    forming the prebonding element to include four elastic elements and a pad to which the four elastic elements connect, wherein four first element points each coincide with one end of each elastic element, a second element point is positioned in a region in the middle of the pad; and
    depositing the patch layer of prebonding material to the region in the middle of the pad.

12. The method according to claim 9, further comprising:
    forming the four elastic elements of the prebonding element such that of the first element points can be connected with a line that is parallel to the first in-plane direction and two of the first element points can be connected with a line that is parallel to the second in-plane direction.

13. The method according to claim 1, further comprising:
    forming to the first wafer an opening and the prebonding element that includes two or more first element points in separate regions through which the prebonding element is fixed to the first wafer, wherein the prebonding element includes two or more elastic elements each extending from one first element point to a common second element point in the middle of the opening.

14. A wafer for bonding to another wafer in a wafer bonding process, wherein the wafer extends planarly in two mutually orthogonal in-plane directions and comprises one or more bonding surface parts, the wafer comprising;

at least a first prebonding element and a second prebonding element, and each of the first and the second prebonding elements includes a first element point, a second element point, and an elastic element wherein the first element point is in a region through which the prebonding element is fixed to the wafer, the elastic element extends from the first element point to the second element point and the elastic element is configured to deflect between the first element point and the second element point to enable movement of the second element point in an out-of-plane direction of the first wafer, wherein the out-of-plane direction is orthogonal to the two in-plane directions, the elastic element in the first prebonding element extends in a first in-plane direction and the elastic element in the second prebonding element extends in a second in-plane direction, and the first in-plane direction is not parallel with the second in-plane direction.

15. The wafer according to claim 14, wherein the wafer includes a patch layer of prebonding material that covers a region around the second element point on the prebonding element and can be activated to form an adherent contact between the prebonding element and the other wafer.

16. The wafer according to claim 14, wherein the wafer is a device wafer layer of a structural wafer.

17. A microelectromechanical system element comprising the wafer according to claim 14.

* * * * *